United States Patent
Payne et al.

(10) Patent No.: US 10,079,987 B2
(45) Date of Patent: Sep. 18, 2018

(54) SIGNAL SIMULATION APPARATUS AND METHOD

(71) Applicant: MESA Imaging AG, Zurich (CH)

(72) Inventors: Andrew Dean Payne, Papamoa (NZ); Adrian Andrew Dorrington, Hamilton (NZ)

(73) Assignee: Heptagon Micro Optics Pte. Ltd., Singapore (SG)

( * ) Notice: Subject to any disclaimer, the term of this patent is extended or adjusted under 35 U.S.C. 154(b) by 1200 days.

(21) Appl. No.: 14/246,262

(22) Filed: Apr. 7, 2014

(65) Prior Publication Data

US 2014/0218570 A1 Aug. 7, 2014

Related U.S. Application Data

(62) Division of application No. 12/738,193, filed as application No. PCT/NZ2008/000271 on Oct. 16, 2008.

(30) Foreign Application Priority Data

Oct. 19, 2007 (NZ) ........................................ 562739

(51) Int. Cl.
| | |
|---|---|
| *G06F 17/50* | (2006.01) |
| *H04N 5/365* | (2011.01) |
| *H03B 28/00* | (2006.01) |
| *H03K 4/02* | (2006.01) |

(52) U.S. Cl.
CPC ........... *H04N 5/3651* (2013.01); *H03B 28/00* (2013.01); *H03K 4/026* (2013.01)

(58) Field of Classification Search
CPC ....... H03B 28/00; H03K 4/026; H04N 5/3651
See application file for complete search history.

(56) References Cited

U.S. PATENT DOCUMENTS

| | | | |
|---|---|---|---|
| 3,596,172 A | 7/1971 | Harrison | |
| 3,676,003 A * | 7/1972 | Pompian et al. | ....... G01S 17/10 356/5.06 |

(Continued)

FOREIGN PATENT DOCUMENTS

| | | |
|---|---|---|
| NZ | 525241 A | 2/2006 |
| NZ | 535322 A | 7/2006 |
| WO | WO2004090568 | * 10/2004 |

OTHER PUBLICATIONS

T.J. Liang et al., "Walsh function method of harmonic elimination," 1993, Applied Power Electronics Conference and Exposition, Conference Proceedings, Eighth Annual , pp. 847-853.*

(Continued)

*Primary Examiner* — Kamini S Shah
*Assistant Examiner* — Russ Guill
(74) *Attorney, Agent, or Firm* — Fish & Richardson P.C.

(57) ABSTRACT

The present invention relates to a method of simulating an initial component of a signal to approximate a component of a reference signal, the method characterized by the steps of:
i. generating a source signal which includes at least one harmonic component, and
ii. determining the average amplitude and duration of the source signal, and
iii. referencing the amplitude of the reference signal component to be simulated, and
iv. integrating the source signal over a period of time sufficient to produce a value for the signal component amplitude approximate to the reference signal component amplitude.

11 Claims, 8 Drawing Sheets

(56) References Cited

U.S. PATENT DOCUMENTS

| | | | |
|---|---|---|---|
| 3,766,551 A * | 10/1973 | Burnsweig, Jr. | G01S 13/288 332/103 |
| 3,767,991 A | 10/1973 | James | |
| 3,786,409 A * | 1/1974 | Sorkin | G01V 1/02 367/137 |
| 4,042,910 A * | 8/1977 | Rietsch | G01V 1/36 181/113 |
| 4,204,278 A * | 5/1980 | Nelson | G01V 1/04 181/119 |
| 4,245,290 A | 1/1981 | Lipman | |
| 4,368,432 A | 1/1983 | Levy | |
| 4,399,564 A | 8/1983 | Cowen | |
| 4,570,125 A | 2/1986 | Gibson | |
| 4,915,498 A * | 4/1990 | Malek | G01S 17/107 342/94 |
| 4,992,751 A | 2/1991 | Attwood et al. | |
| 5,047,910 A | 9/1991 | Levran et al. | |
| 5,141,308 A * | 8/1992 | Danckwerth | G01S 17/102 356/5.05 |
| 5,410,517 A * | 4/1995 | Andersen | G01V 1/375 181/108 |
| 5,563,605 A | 10/1996 | McEwan | |
| 5,833,614 A * | 11/1998 | Dodd | G01S 7/52038 600/447 |
| 5,886,586 A | 3/1999 | Lai et al. | |
| 6,323,942 B1 * | 11/2001 | Bamji | G01C 3/08 348/E3.018 |
| 6,614,537 B1 * | 9/2003 | Yahashi | G01B 11/24 356/3.04 |
| 6,683,494 B2 | 1/2004 | Stanley | |
| 6,906,793 B2 | 6/2005 | Bamji et al. | |
| 7,094,204 B2 * | 8/2006 | Banjanin | G01S 7/52047 600/443 |
| 2002/0176067 A1 * | 11/2002 | Charbon | G01S 7/487 356/4.01 |
| 2005/0007879 A1 | 1/2005 | Nishida | |
| 2006/0145755 A1 | 7/2006 | Chen et al. | |
| 2006/0293595 A1 * | 12/2006 | Clark | G01S 7/52046 600/437 |
| 2008/0219648 A1 | 9/2008 | Liu | |

OTHER PUBLICATIONS

John Chiasson et al., "A complete solution to the harmonic elimination problem," 2003, Eighteenth Annual IEEE Applied Power Electronics Conference and Exposition 2003, pp. 596-602.*

J.R. Wells et al., "Generalization of selective harmonic control/elimination," 2005, IEEE 36th Power Electronics Specialists Conference, pp. 1358-1363.*

J. Sun et al., "Pulsewidth modulation based on real-time solution of algebraic harmonic elimination equations," 1994, 20th International Conference on Industrial Electronics, Control and Instrumentation IECON '94, pp. 79-84.*

Maciej Ogorzalek, "Week 7 Digital and Analogue Modulation Quantisation," Apr. 10, 2007, Wayback Machine, 67 pages.*

M.J. Cree et al., "A heterodyning range imager," 2005, IAPR Conference on Machine Vision Applications, pp. 80-83.*

W. Wilkening et al., "Phase-coded pulse sequence for non-linear imaging," 2000, 2000 IEEE Ultrasonics Symposium, pp. 1559-1562.*

Smith, Ralph J., "Circuits, Devices and Systems," John Wiley & Sons, 1968, pp. 447-451.

Suh, S. Y., "Pulse width modulation for analog fiber-optic communications," Journal of Lightwave Technology, 1987, vol. LT-5, No. 1, pp. 102-112.

Enjeti, Prasad N., et al., "Programmed PWM Techniques to Eliminate Harmonics: A Critical Evaluation," IEEE Transactions on Industry Applications, 1996, vol. 26, No. 2, pp. 302-316.

Smedley, K.M., "Integrators in Pulse Width Modulation," Power Electronics Specialists Conference, PESC '96, IEEE, Jun. 23-27, 1996, vol. 1, pp. 773-781.

"Frequency and Resoluation Options for PWM Outputs," Microchip, 2002, 13 pages.

"Using a Function Generator to Create Pulse-Width Modulation Waveforms," Agilent Technologies, 2003, pp. 1-4.

Pfeifer, George F., "Pulse Modulation/Demodulation," from "Standard Handbook of Electronic Engineering," McGraw-Hill, 2004, pp. 12.28-12.49.

Zheng, Y. et al., "Pulse Width Modulator Using a Phase-Locked Loop Variable Phase Shifter," May 23-26, 2004, vol. 4, pp. 3639-3642.

De Silva, Clarence W., "Signal Conditioning and Modification," from "Vibration and Shock Handbook," CRC Press, 2005, pp. 16-1 to 16-67.

Kim, H. et al., "Pulse Width Modulation Circuits Using CMOS OTA," IEEE Transactions on Circuits and Systems, 2009, vol. 53 (.9), pp. 1869-1878.

International Search Report and Written Opinion, International Searching Authority (AU), PCT/NZ2008/000271, dated Feb. 24, 2009.

International Preliminary Report on Patentability, The International Bureau of WIPO, PCT/NZ2008/000271, dated Apr. 20, 2010.

* cited by examiner

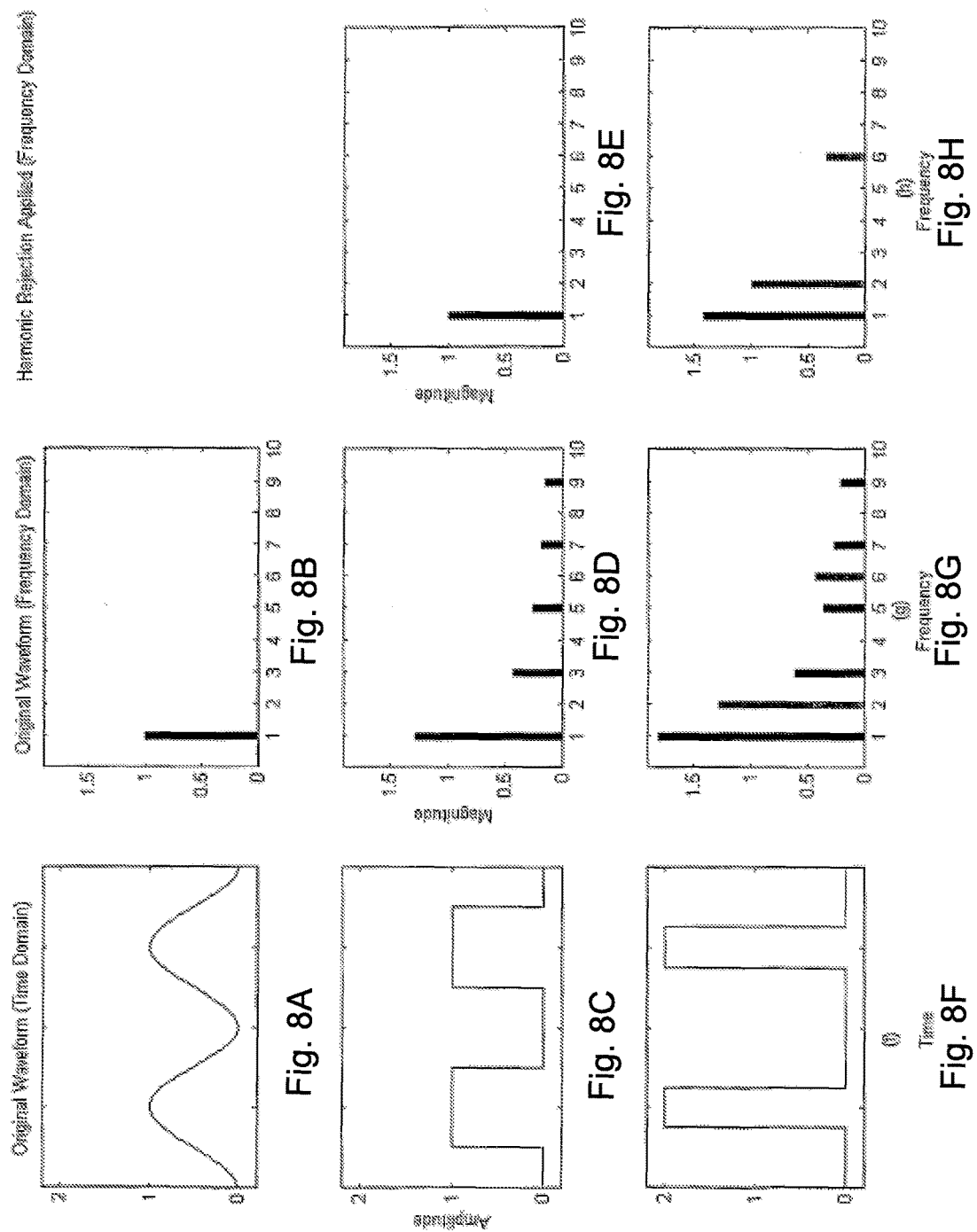

SIGNAL SIMULATION APPARATUS AND METHOD

RELATED APPLICATIONS

This application is a Divisional of U.S. application Ser. No. 12/738,193 filed on Jun. 23, 2010, which is a 371 of PCT/NZ2008/000271 filed Oct. 16, 2008, both of which are incorporated herein by reference in their entirety.

This application claims priority to New Zealand Patent Application No. 562739 filed on Oct. 19, 2007, which is incorporated herein by reference in its entirety.

BACKGROUND OF THE INVENTION

In a number of applications there is a requirement for the provision of sinusoidal waveform signals to drive the modulation of other signals, or to modify transducer outputs. Sinusoidal waveform signals are selected in a number of instances to minimize the number of harmonic components present in a signal other than its base frequency.

For example, imaging range finding or range imaging applications modulate both a light source for a scene and an imaging transducer with a common modulation frequency. Phase differentials are detected between the output source and received transducer signals to provide an indication as to the range to a particular object in the illuminated scene. An example of this type of image ranging technology is disclosed in the patent specification published as PCT Publication No, WO2004/090568.

Other types of phase sensitive imaging applications have also been developed which require the provision of such modulation signals; such as for example, diffusion tomography, intensity modulated optical spectrometry (IMOS) and fluorescence lifetime imaging (FLM) applications.

The processing algorithms and mathematics employed in such applications often rely on the assumption that the modulation or sampling frequencies used are sinusoidal. However, in practice these expected sine waves are commonly provided by square waves which can be easily generated using off the shelf, low cost digital components.

Square waves include a number of higher order harmonic frequencies in their make up. These high order harmonics can introduce a source of error with respect to measurements of phase completed with respect to such imaging systems.

To address this problem a well known sinusoidal wave generation technique can be used to provide a sine wave from a number of phase separated square waves with varying peak amplitudes. These phase separated square waves are summed together simultaneously, with the number of input square waves used being dictated by the resolution of the sine wave simulation required.

However, this sine wave simulation technique does cause practical difficulties with respect to the physical circuitry required to implement a signal generation apparatus. The resolution of the sine wave provided is directly dictated by the number of square wave generators available, where the provision of a large number of square wave generation signals may not necessarily be practical or cost effective in a number of applications. This approach also necessitates signal use of analogue waveforms, as a result of the summation process.

Furthermore, the summation of several digital signals, comprising of only two voltage levels, generates a signal of multiple voltage levels that is essentially analogue in nature, negating the advantages of digital transducer modulation.

An improved signal simulation apparatus and/or method of simulating signals which addressed any or all of the above problems would be of advantage. In particular a signal simulation system which could provide or approximate an analogue signal with a minimum number of harmonic components using a single square wave generation circuit would be of advantage.

All references, including any patents or patent applications cited in this specification are hereby incorporated by reference. No admission is made that any reference constitutes prior art. The discussion of the references states what their authors assert, and the applicants reserve the right to challenge the accuracy and pertinency of the cited documents. It will be clearly understood that, although a number of prior art publications are referred to herein, this reference does not constitute an admission that any of these documents form part of the common general knowledge in the art, in New Zealand or in any other country.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

It is an object of the present invention to address the foregoing problems or at least to provide the public with a useful choice.

Further aspects and advantages of the present invention will become apparent from the ensuing description which is given by way of example only.

SUMMARY OF THE INVENTION

According to one aspect of the present invention there is provided a method of simulating an initial component of a signal to approximate a component of a reference the method characterized by the steps of;

generating a source signal which includes at least one harmonic component, and ii) determining the average amplitude and duration of the source signal, and iii) referencing the amplitude of the reference signal component to be simulated, and iv) integrating the source signal over a period of time sufficient to produce a value for the signal component amplitude approximate to the reference signal component amplitude.

According to another aspect of the present invention there is provided a method of simulating a signal approximating a reference signal with reference to the method as previously described, including the further steps of;

v) phase shifting the source signal, and vi) repeating steps (iii) to (v) until the required simulation of the signal approximating the reference signal has occurred.

According to yet another aspect of the present invention there is provided a signal simulation apparatus which includes, a source signal generator configured to generate a source signal which includes at least one harmonic component, and a phase adjustment element configured to adjust the phase of a source signal supplied by the source signal generator, and a simulation signal output element configured to output a simulation signal consisting of the source signal which has been phase shifted by the phase adjustment element, characterized in that the simulation signal output is composed from the source signal which has been phase adjusted over a number of given time periods to make up an integration period to provide a simulation signal.

According to a further aspect of the present invention there is provided a transducer output system wherein the simulation signal substantially as described above is employed to modulate the operation of a transducer during the integration period.

According to a further aspect of the present invention there is provided a transducer output system which includes, a signal integration element configured to integrate at least one transducer signal supplied by a transducer over an integration period, and a signal simulation apparatus substantially as described above, and a transducer modulation element configured to modulate the operation of the transducer using a simulation signal output by the signal simulation apparatus.

The present invention is adapted to provide a method of simulating a signal and an associated signal simulation apparatus. This methodology may also be employed to provide or implement a transducer output system which uses the simulation signal provided.

The present invention aims to provide a simulation signal which does not suffer from the error effects caused by higher order signal harmonic components, and which is preferably provided using a single source signal.

In particular, the present invention has application in transducer output systems which integrate a transducer's output over an integrated period. This integration period allows for the use of one signal generator circuit only, where the phase of the source signal can be incremented during the integration period to simulate a signal with a minimum number of harmonic components.

The present invention may also be implemented entirely using digital electronic components to provide a digital output signal to provide driving electronics designs which are less prone to distortion or noise effects, as discussed further below.

Reference in general will also be made to the present invention being employed with a transducer output system, where the simulation signal provided is used to modulate the operation of a transducer and the output of this transducer is integrated over an integration period. However, those skilled in the art should appreciate that the present invention need not necessarily be used to modulate the operation of transducers, and reference to the above throughout this specification should in no way be seen as limiting.

Furthermore, those skilled in the art should appreciate that well known digital imaging components may be employed to provide such a transducer in imaging applications which employ the present invention. For example, in one embodiment a transducer modulation element may be formed by a gain modulation component such as an image intensification element. This gain modulation component may receive or employ the signal provided in accordance with the present invention to in turn modulate the operation of a further light sensitive transducer element, or an array of such elements. In another possible embodiment, the simulation signal may be directly applied to a gain modulated active pixel sensor array.

The present invention may employ a single source signal generator used to generate a source signal which includes at least one harmonic component. In preferred embodiments such a source signal generator may be provided by digital electronic components. For example, the present invention may preferably employ square wave generation circuitry which can be easily implemented using digital componentry.

Square waves have multiple higher order harmonic components other than the base frequency of the wave. Due to the sharp transitions of the corners of the square wave a significant fraction of the energy of the square wave is made up from these higher order harmonic components. The present invention aims to employ such source signals with harmonic components while removing the error causing effects of same.

In a preferred embodiment a source signal generator employed in conjunction with the present invention may be formed by a field programmable gate array (FPGA). FPGAs are well known in the field of digital signal processing and may be employed to provide two or more square waves which have their phases locked with respect to one another, as would be required where the present invention is employed in range imaging applications.

However, those skilled in the art should appreciate that other types of components or circuits may be employed to provide both a source signal and source signal generator, and reference to FPGAs should in no way be seen as limiting. For example, direct digital synthesisers, application specific integrated circuits, complex programmable logic devices, or programmable logic arrays may all be employed if required in applications which implement the present invention.

It is also foreseen that the present invention may be implemented using signal generation and control electronics which are integrated into the sensor chip of a range imaging camera.

Reference throughout this specification wilt also be made to a source signal being provided by a square wave signal. Again, those skilled in the art should appreciate that other types of source signals which also include harmonic components (such as for example, saw-tooth or triangular waves), may be employed as a source signal if required.

In a preferred embodiment the present invention may be employed to simulate a sinusoidal simulation signal using a single source signal which contains a number of harmonic components.

In order for harmonic components to affect the phase measurement of the signal, each harmonic must be present in both the light source waveform and image intensifier waveform. If one of those waveforms is effectively reduced to a sinusoid, which is composed of only the fundamental frequency, then the harmonics are eliminated. As such, the sinusoidal simulation signal provided by the present invention therefore has the effect of cancelled out these harmonic components and hence removes or at least mitigates sources of error associated with same, without requiring the use of calibrations.

In a further preferred embodiment the present invention may be employed to simulate a signal which contains a minimum number of harmonic components.

In further preferred embodiments the number of odd order harmonic components may be minimised. In particular applications for the present invention the sampling scheme employed may be used to negate error contributions of even order harmonic components, thereby leaving only odd order harmonics to be removed from the simulation signal to be provided. For example, in such applications an even number of equally spaced samples may be collected over the waveform period.

Reference in general will also be made throughout this specification to the present invention being employed to simulate a sinusoidal signal. However, those skilled in the art should appreciate that other types of signals with variations in wave shape may also be simulated in accordance with the present invention. For example (and as discussed further below), variations in forms which deviate from the standard sinusoid waveform may also be simulated in conjunction with the present invention if required.

The simulation signal is provided directly by the source signal, where the source signal is phase shifted after or at given time periods.

In a preferred embodiment the phase of the source signal may be incremented by regular amounts, while the presentation time for each phase may be varied. This variation in presentation time can be employed to simulate the desired signal which is to have a minimised number of harmonic components. The actual presentation time used for each phase increment may be taken from or given as a value proportional to the absolute value of amplitude change experience over the phase increment involved. This ratio of amplitude separation can therefore be employed to control or set a presentation time for each regular phase increment of the source signal, In a preferred embodiment the given length of time at which a fixed phase incrementation of the source signal is presented as the simulation signal will control the effective amplitude of the simulation signal during this given presentation time.

In such embodiments the size of the regular phase increment applied to the source signal can be determined through the resulting resolution required of the simulation signal, and hence the number of harmonic components to be removed or cancelled from the simulation signal. A large number of small phase increments may be applied during an integration period associated with the use of the simulation signal, or alternatively a small number of large phase increments may be employed.

Those skilled in the art should appreciate that the selection of the size of a particular phase increment will be directly determined by the application in which the present invention is employed. This may be due to accuracy requirements, restrictions on power or processing factors, budget restrictions etc.

In other embodiments a fixed phase increment adjustment may not be employed with a variable given presentation time to provide a simulation signal. For example, in an alternative embodiment a simulation signal may be provided by presenting a phase shifted source signal which has a variable phase adjustment applied in combination with a fixed given presentation time period common to each phase adjustment.

For example in such alternative embodiments a similar approach can be taken to calculate the phase change required as that discussed above with respect to the calculation of presentation time. In such instances the presentation time used will be a fixed incremental value which can be cross referenced against the form of the signal to be simulated to determine the value of phase adjustment to be applied.

As discussed above the present invention is configured to provide a method of generating a simulation signal in addition to an associated signal simulation apparatus. Such signal simulation apparatus may preferably be implemented through the provision of a programmable logic device which includes a square wave generation circuit. Such a programmable device should also provide the facility to increment the phase of the source signal generated, in addition to appropriate signal output ports or connections.

For example, in a further preferred embodiment the entire signal simulation apparatus may be provided through a single FPGA programmed with an appropriate configuration. This single FPGA may be employed to generate a single square wave where the configuration or instructions programmed in association with the FPGA adjust of the phase of this square wave at given time periods to apply same to an output stage of the FPGA.

Reference throughout this specification wilt also be made to the signal simulation apparatus provided in accordance with the present invention being formed from an appropriately programmed or configured FPGA. However, those skilled in the art should appreciate that other forms of physical components or elements may also be used to provide such an apparatus if required.

The present invention may also encompass a methodology used to enhance a signal to noise ratio for a resulting simulation signal.

For example in some embodiments a source signal may be employed which has a duty cycle of less than 1:1 or 50%. The duty cycle of a source signal may be decreased in such embodiments in combination with maintaining the same average power within the resulting source signal. The maintenance of power levels coupled with a decrease in duty cycle will result in an increase in signal to noise ratio.

For example, in one embodiment a source signal may be provided by a square wave with a 1:3 or 25% duty cycle. Normally the selection of an arbitrary waveform shape to maximise signal to noise ratios would in turn introduce additional error causing harmonic components. However, the basic methodology of the present invention (employing periodic phase changes in a source signal) to simulate a reference signal can address these harmonic errors as discussed above. By reducing the duty cycle below 50% for a source signal this will provide a larger fundamental frequency component which is desirable for signal to noise considerations.

Although this approach increases errors due to harmonic components, these harmonic problems are minimised through the basic approach of the present invention.

Those skilled in the art should appreciate that in such embodiments the simulation signal need not necessarily be exactly sinusoidal in form or shape when the duty cycle of the source signal is modified from 50%. Those skilled in the art should appreciate that in such embodiments the actual shape of the simulation signal or waveform may deviate from the shape of a reference or traditional sinusoidal wave.

The present invention may provide many potential advantages over the prior art.

The present invention may be used to:

simulate a sinusoidal signal containing a minimum number of harmonic components using a single input source signal, reducing componetry and processing requirements;

enhance the signal to noise ratio of a simulation signal by reducing the duty cycle of the source signal, while reducing the effect of the resulting harmonic components.

BRIEF DESCRIPTION OF THE DRAWINGS

Further aspects of the present invention will become apparent from the following description which is given by way of example only and with reference to the accompanying drawings in which:

FIGS. 8A-8H illustrate the effect of employing the alternate source signals shown with respect to FIGS. 7A and 7B.

DETAILED DESCRIPTION OF THE PREFERRED EMBODIMENTS

Figure 1:
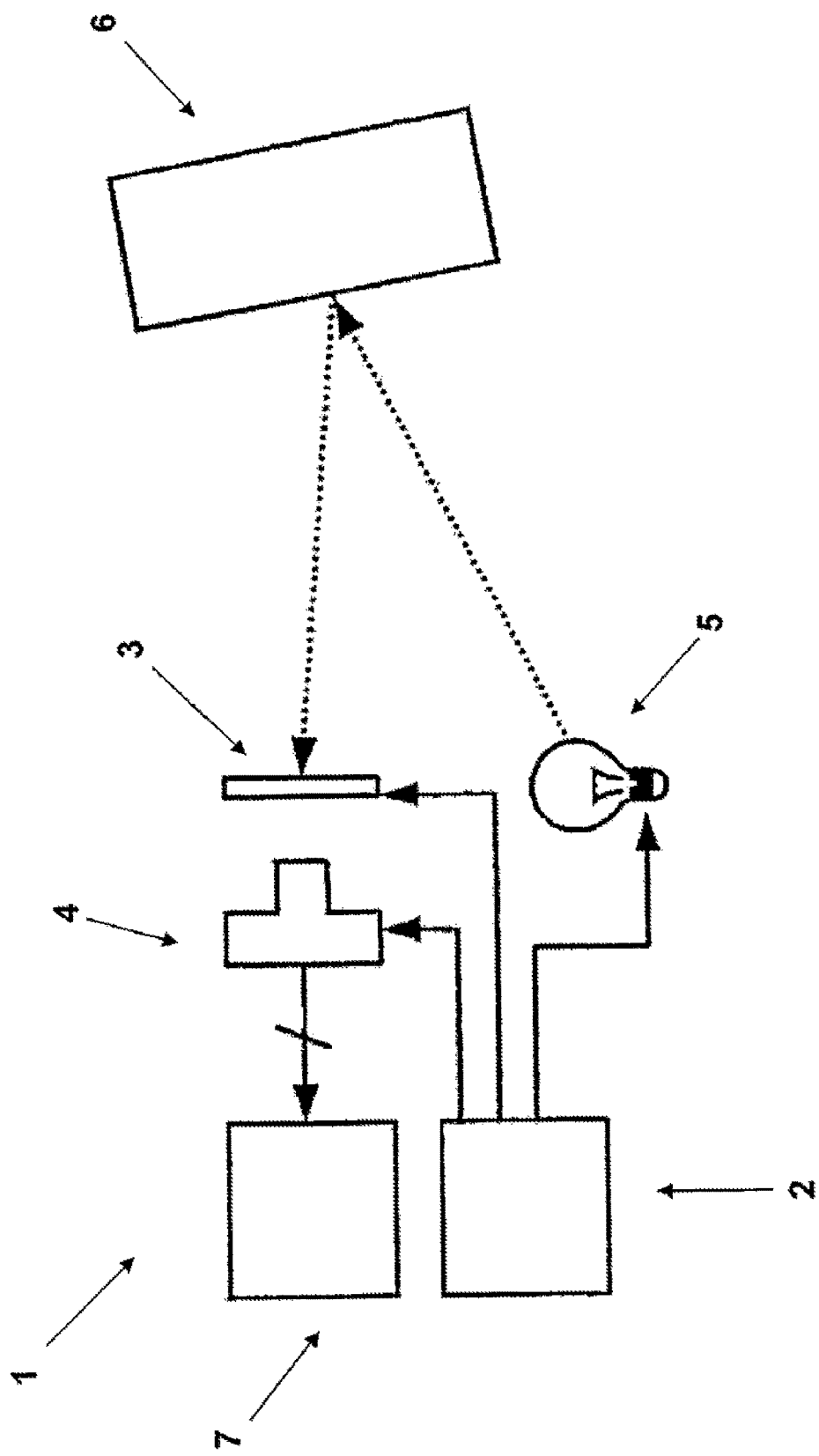
FIG. 1 shows an exemplary schematic diagram of a set of components employed to provide a range imaging system which can employ the present invention.

FIG. 1 shows an exemplary schematic diagram of a set of components which provide a range imaging system (generally illustrated by arrow 1) which can employ the present invention.

As can be seen from FIG. 1 an FPGA (2) can be employed as a signal simulation apparatus to provide a modulation signal to both an image intensifier (3) associated with an optical camera transducer (4), in addition to a light source (5) used to illuminate an object (6) to have its range assessed. The resulting data is transmitted to and processed by a processing device (7). Further details with respect to these particular types of range imaging systems are also disclosed in PCT Publication No. WO2004/090568.

As can be appreciated by those skilled in the art that FPGAs are readily available and may be obtained at comparatively low cost when compared with analogue signal generation circuitry, and in high-precision phase-locked particular pure sine wave generation circuits. An FPGA can readily generate square wave signals which have high order harmonic components, where the square wave signals are phased locked with respect to one another. Phase locking the modulation signals produced by the FPGA ensures that any phase differentials measured by the range imaging system accurately represent the range of the object illuminated.

Figure 2A:
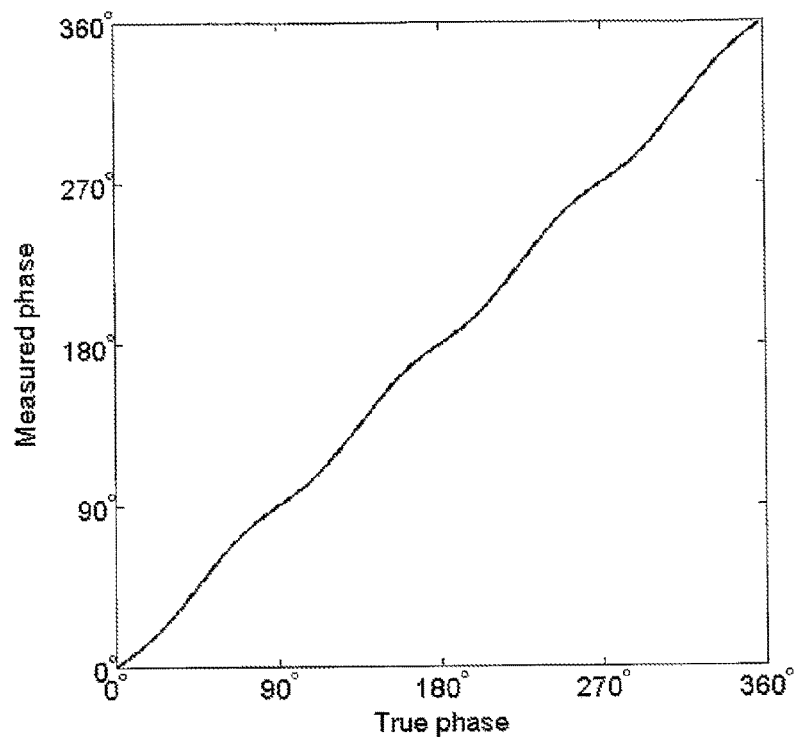
FIGS. 2A and 2B illustrate phase measurement errors introduced by the presence of harmonic components in the signals used to modulate the light source and camera of the system shown with respect to FIG. 1, and FIGS. 3A-3D illustrate a prior art sinusoidal signal generation technique which employs a group of square wave signal generation circuits which have their output summed instantaneously to provide an sinusoidal signal.
Figure 2B:
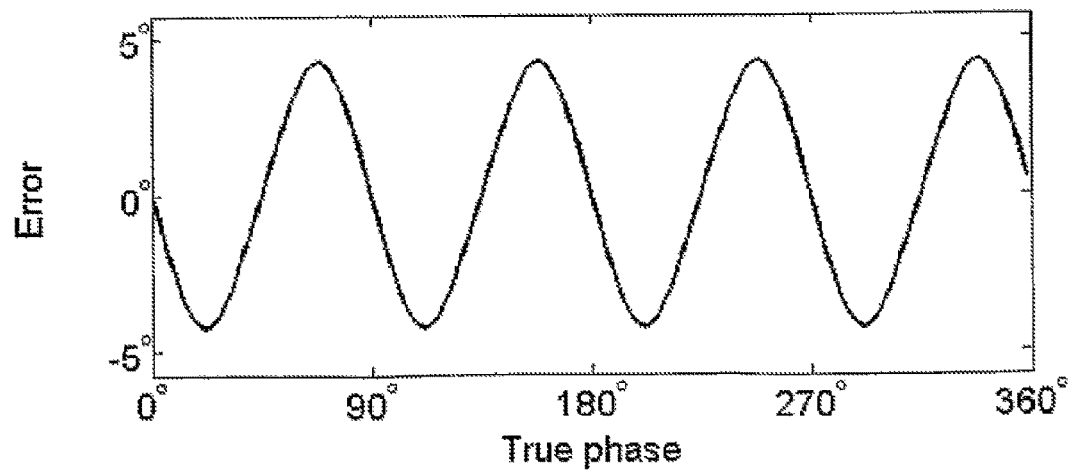

FIGS. 2a and 2b illustrate phase measurement errors introduced by the presence of harmonic signal components in the signals used to modulate the light source and image intensifier of the system shown with respect to FIG. 1.

As can be seen from FIGS. 2a and 2b the use of square waves as modulation signals does introduce a regular source of error. One approach which could remove this error would be through the preparation of a calibration of the system for each modulation frequency employed.

However, those skilled in the art would appreciate that the use of multiple calibrations introduces its own problems in terms of both preparing and maintaining calibrations for each and every modulation frequency to be employed.

In order for harmonic signal components to affect the phase measurement, each harmonic must be present in both the light source waveform and image intensifier waveform. If one of those waveforms is effectively reduced to a sinusoid, then the harmonics not present in that waveform are eliminated, As such, the present invention may be used to remove or at least mitigate this source of error without requiring the use of calibrations.

FIG. 3 illustrates a prior art sinusoidal signal generation technique which employs a group of square wave signal generation circuits. These signals are summed instantaneously to provide an output sinusoidal signal.

Figures 3A, 3B, 3C, 3D:
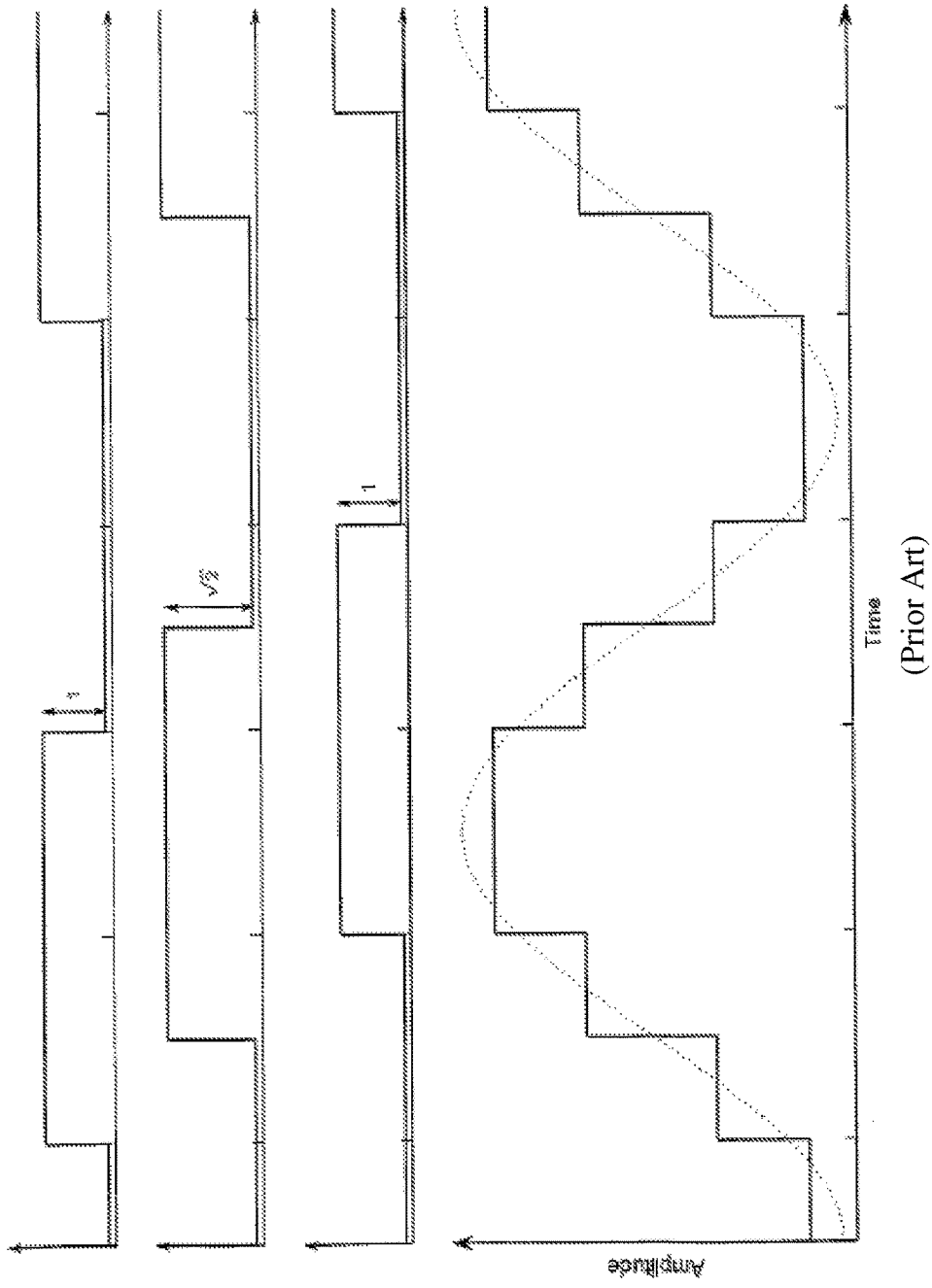

FIG. 3d illustrates a sinusoidal simulation signal with a dotted outline of the actual sinusoidal signal simulated. The simulation signal is simulated through the instantaneous summation of the three phase separated square waves (FIGS. 3a, 3b and 3c) illustrated, A regular phase increment is applied between each square wave, while variations are seen in the maximum amplitude of the waves.

As more signal generation circuits are made available the resolution of the resulting simulation signal is improved and further higher order signal harmonic components are removed. However, the use of additional signal generation circuits increases the manufacturing costs and system design complexity of any apparatus which is to employ this type of instantaneous summation. This process also generates an inherently analogue output signal, which negates the benefits of using a digital system.

Figure 4:
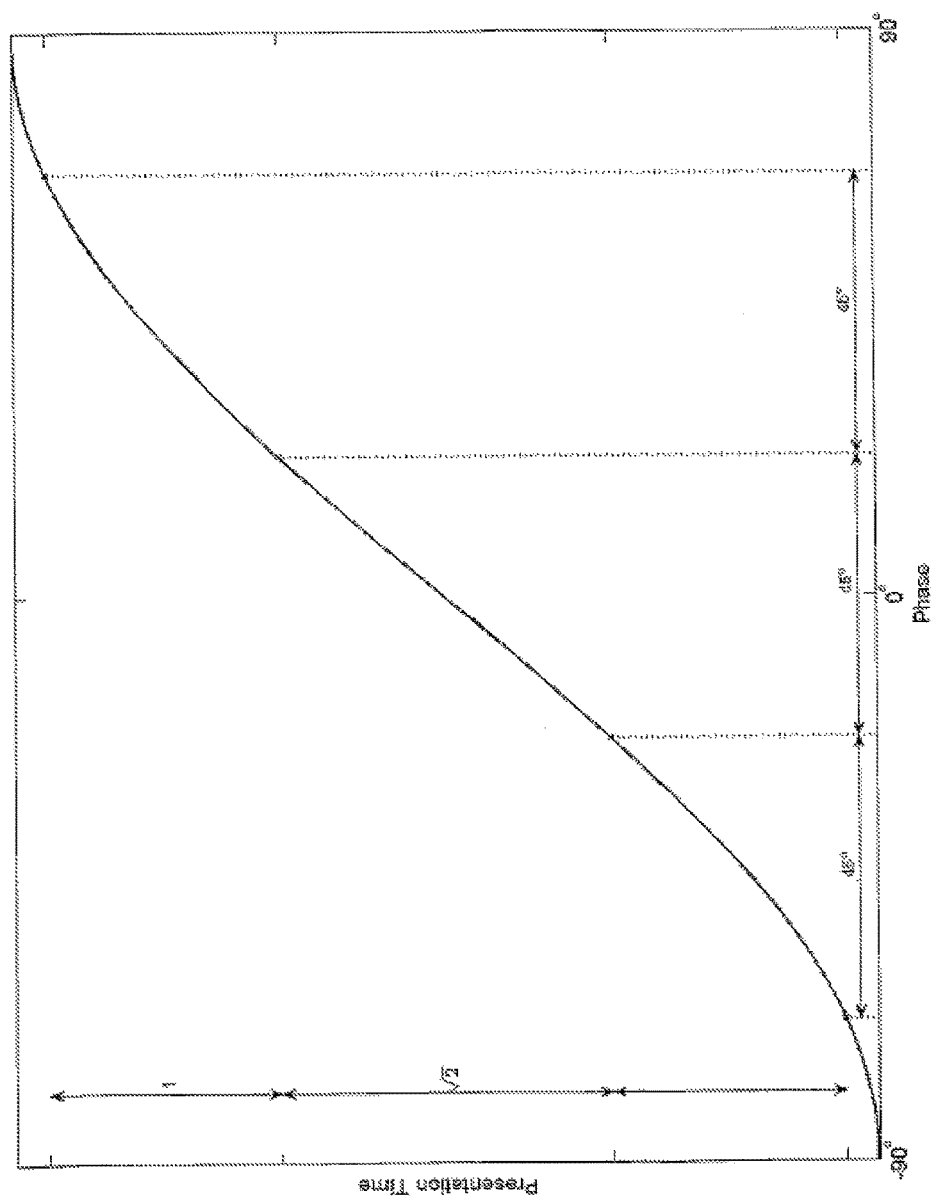
FIG. 4 shows a plot of a section reference signal to be simulated when used to calculate the presentation time of each regular phase increment employed in a preferred embodiment.

FIG. 4 shows a plot of section reference signal to be simulated used to calculate the presentation time of each regular phase increment employed in a preferred embodiment.

The method of calculating presentation time illustrated samples a sine wave over the period $-90°$ to $90°$, with sample resolution equal to the electronic phase step resolution to be used. The presentation time can therefore be taken as the ratio of separation between the resulting amplitude values.

In the case shown, four samples are taken symmetrically about $0°$ with $45°$ separation (i.e. $-67.5°$, $-22.5°$, $22.5°$, $67.5°$) giving three ratios $(1, \sqrt{2}, 1)$. It is also possible to take five samples over the same period ($-90°$, $45°$, $0°$, $45°$, $90°$), or four samples with different values (e.g. $-80°$, $35°$, $10°$, $55°$). There are an infinite number of possible ratios, with the example values used $(1, \sqrt{2}, 1)$ being one case only.

It should be appreciated that a selection of the resolution of the samples taken is directly determined by the application in which the present invention is implemented. Factors such as the equipment available or required accuracy will influence the sample resolution which is selected to be implemented.

Figure 5A:
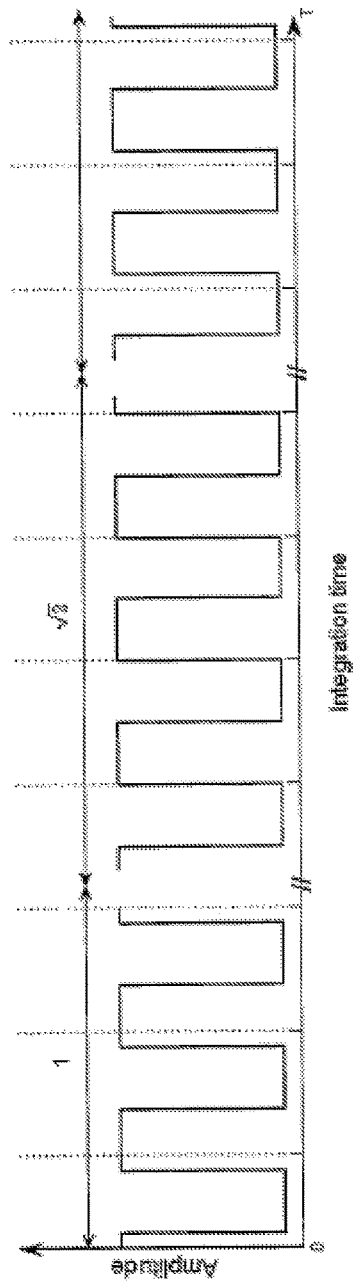
FIGS. 5A and 5B illustrate timing diagrams over an integration period of the phase adjusted source signal, and a simulation signal provided in the embodiment shown with respect to FIG. 4, and FIGS. 6A-6D illustrate experimental results of the reduction in measured phase error using the present invention.
Figure 5B:
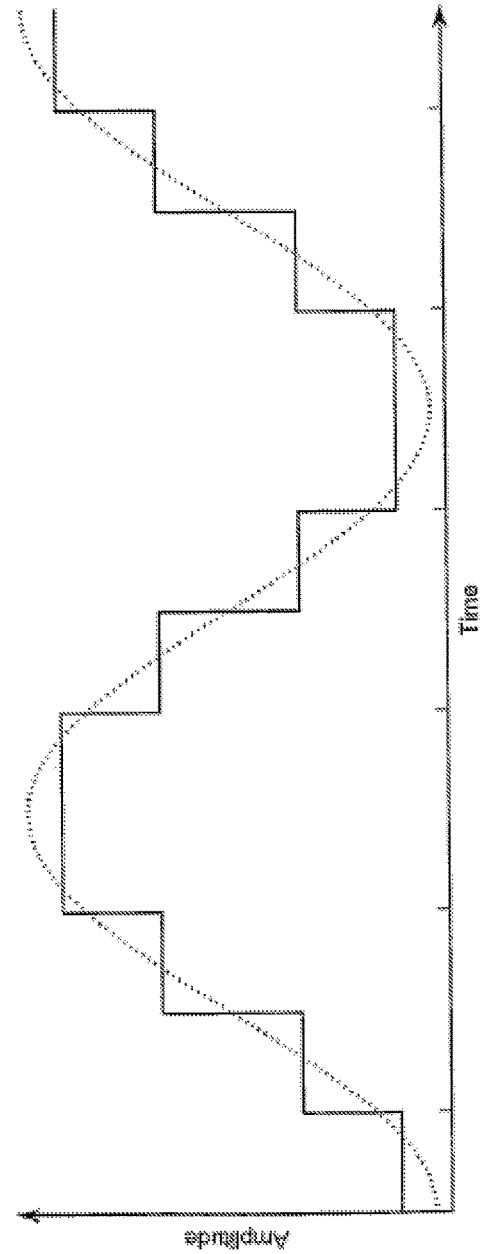

FIG. 5a, 5b illustrates timing diagrams over an integration period of the phase adjusted source signal and a simulation of a signal provided in the embodiment discussed with respect to FIG. 4.

In particular FIG. 5a illustrates the form and phase of the source signal applied over a variable presentation time. As can be seen from FIG. 5a presentation time varies in accordance with the scheme discussed and illustrated with respect to FIG. 4 for each of the phase increments applied to the source signal.

The effective result of this approach is illustrated with respect to FIG. 5b which shows an effective simulation signal when compared with the fundamental frequency of reference sine wave in dotted outline. Those skilled in the art should obviously appreciate that an effective simulation signal is illustrated but this signal does not actually exist at any instantaneous point in time, but provides the same result due to its action over the integration time period involved.

FIGS. 6a, 6b, 6c and 6d illustrate experimental results with regard to phase measurement error introduced by harmonic signal components in the signals used to modulate the light source (5) and image intensifier (3) of the system (1) shown in FIG. 1, and the effect of the present invention on same.

Figure 6A:
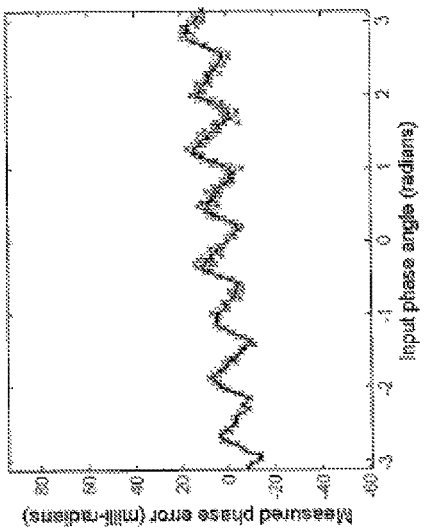

FIG. 6a illustrates the measured phase error of the system (1) using a traditional homodyne (no phase increment) method. The principal systematic error is due to the 3rd and 5th order harmonic components of the signal.

The linear variation from left to right is due to the heating of the particular experimental set up used to obtain these results during each acquisition sequence, as the extended period of operation required to obtain thermal equilibrium was not sustainable. This should be understood to be a limitation of the particular componetry, and not the invention itself.

Figure 6B:
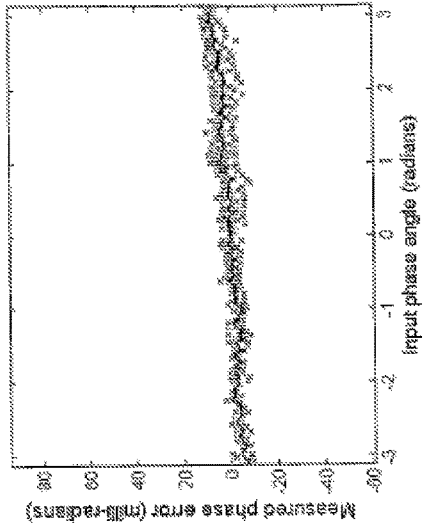

The reduction in measured phase error using the present invention may be seen in FIG. 6b. FIG. 6b illustrates the resulting error with a phase increment of 45° according to the method described with reference to FIG. 4. It may be seen that the error has been reduced by 8 times by the application of the present invention, due to the elimination of the error caused by the 3rd and 5th harmonics.

Figure 6C:
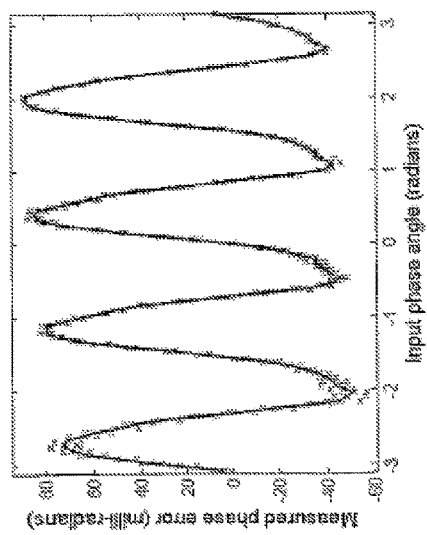
Figure 6D:
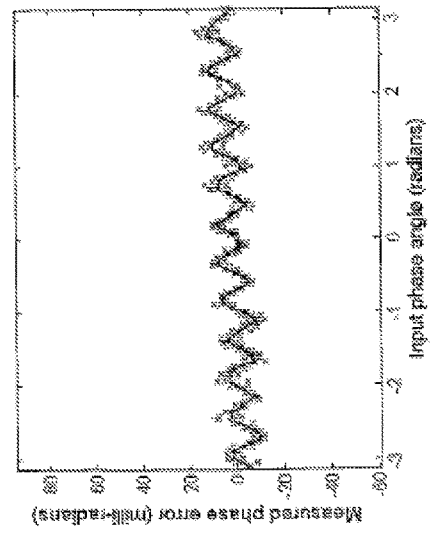

FIGS. 6c and 6d illustrate the resulting error with phase increments of 22.5° and 3° respectively. In FIG. 6d the present invention has eliminated the error due to harmonics up to the 119th order harmonic, from which point the systematic error is negligible in comparison to other sources of systematic error.

Figure 7A:
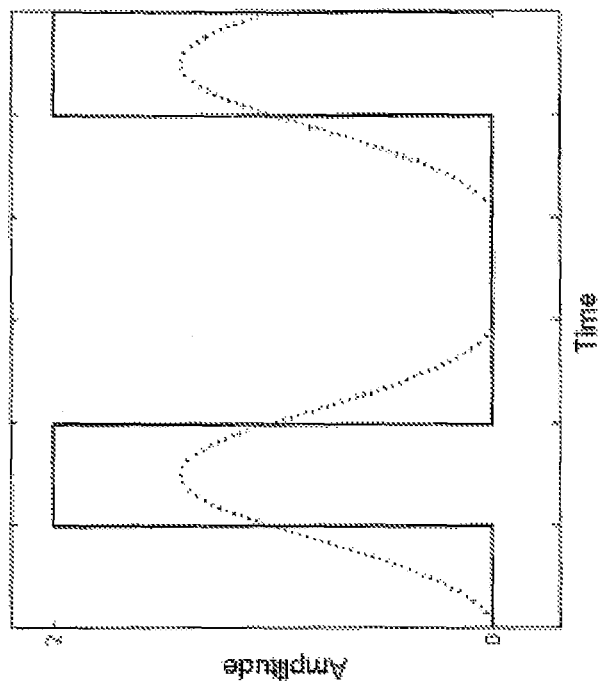
FIGS. 7A and 7B illustrate two alternative source signals which can be employed with the present invention.
Figure 7B:
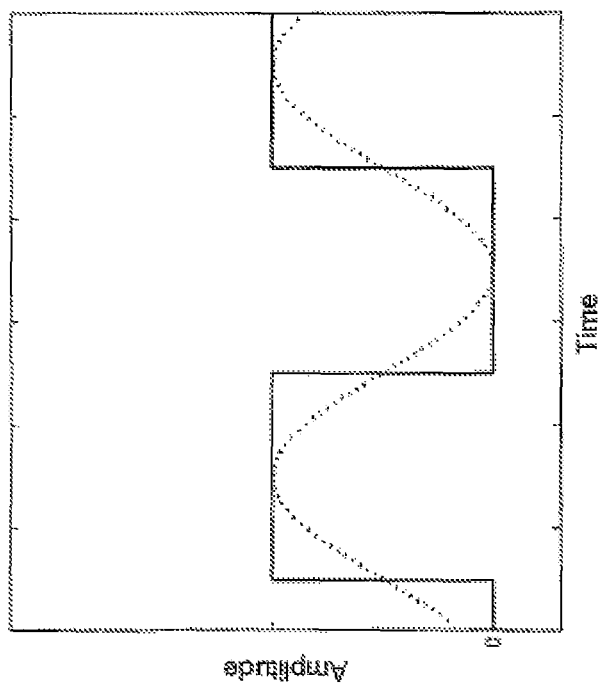

FIGS. 7a, 7b illustrate two alternative source signals which can be employed with the present invention, where the signal of FIG. 7a has a duty cycle of 50 percent and a signal of FIG. 7b has a duty cycle of 25 percent.

As can be seen from FIG. 7a the dotted outline illustrates a reference sinusoidal signal with a fundamental frequency which is to be simulated. This may be contrasted with the square wave source signal shown with respect to FIG. 7b which has a duty cycle of 1:3 or 25 percent. As can be clearly seen in FIG. 7b, the amplitude of the simulated signal is significantly greater using a duly cycle reduction approach. Both waveforms have the same average power, while neither waveform contains error causing odd order harmonics FIGS. 8a-8h illustrate three alternate source signals along with their resultant magnitude of their fundamental frequency and harmonic components respectively before and after the present invention has been employed.

FIG. 8a illustrates a sinusoidal modulation waveform in the Time Domain. FIG. 8b shows the magnitude of the components of the same waveform in the Frequency Domain. As the sine wave consists of only the fundamental frequency component, no harmonics and their associated error is present.

FIG. 8c illustrates a square modulation waveform with a 50% duty cycle, having the same average power as the sine wave of FIG. 8a.

FIG. 8d shows the magnitude of the components of the waveform of FIG. 8c in the Frequency Domain. The odd harmonic components may be seen.

Applying the present invention, the harmonic components are eliminated, as seen in FIG. 8e. However, it should be noted that the magnitude of the fundamental frequency component has been reduced. With this reduction, the signal to noise ratio is decreased and the precision of the range measurement is subsequently impacted.

FIG. 8f illustrates a square modulation waveform with a 25% duty cycle, again with the same average power as the waveforms in FIGS. 8a and 8c.

In FIG. 8g the magnitude of the components of the same waveform may be seen in the Frequency Domain. Although the even harmonics are illustrated, they may be effectively ignored as they do not influence the range measurement with normal implementation of the present invention (capturing an even number of samples).

When the present invention is employed, the odd harmonics are eliminated as illustrated in FIG. 8h. The magnitude of the fundamental frequency component is significantly greater than that of the waveforms shown in FIG. 8b or 8e.

As a result the signal to noise ratio and hence the precision of the measurement is increased. When coupled with the increased accuracy due to reduction in systematic error due to harmonic components, the present invention provides higher measurement performance than existing systems which use either true sinusoidal or purely square modulation.

Aspects of the present invention have been described by way of example only and it should be appreciated that modifications and additions may be made thereto without departing from the scope thereof.

What is claimed is:

1. An imaging system, comprising:
   a range assessment system operable to assess a range of an object;
   a light source operable to illuminate the object with a source signal; and
   a signal simulation apparatus operable to provide modulation signals to the light source and the range assessment system, wherein the modulation signals are compensated to mitigate error arising from harmonics in the source signal, wherein the signal simulation apparatus is operable to vary a respective phase of the modulation signals and to vary a respective presentation time for each phase, and wherein the presentation time used for each particular phase increment is proportional to an absolute value of an amplitude change experienced over the particular phase increment.

2. A system as claimed in claim 1, wherein the range assessment system comprises an optical camera transducer.

3. A system as claimed in claim 2, wherein the range assessment system further comprises an image intensifier.

4. A system as claimed in claim 1, wherein the signal simulation apparatus is operable to adjust a phase of the modulation signals supplied to the light source to mitigate error arising from the harmonics.

5. An imaging method, comprising:
   providing modulation signals to a light source and a range assessment system;
   illuminating an object with a source signal generated by the light source in response to the modulation signals;
   operating the range assessment system in response to the modulation signals; and
   mitigating error arising from harmonics in the source signal by adjusting the modulation signals including varying a respective phase of the modulation signals and varying a respective presentation time for each phase, wherein the presentation time used for each particular phase increment is proportional to an absolute value of an amplitude change experienced over the particular phase increment.

6. A method as claimed in claim 5, wherein the source signal includes at least one harmonic component.

7. A method as claimed in claim 5, further comprising integrating the source signal over a period of time sufficient to produce a value for a signal component amplitude corresponding to a reference signal component amplitude.

8. A method as claimed in claim 5, further comprising compensating the modulation signals to phase shift the source signal.

9. A method as claimed in claim 5, further comprising phase shifting the source signal in accordance with a resolution.

10. A method of claim 5 including applying periodic phase changes to the source signal.

11. An imaging method, comprising:
providing modulation signals to a light source and a range assessment system;
illuminating an object with a source signal generated by the light source in response to the modulation signals;
operating the range assessment system in response to the modulation signals;
determining a respective presentation time by sampling a sine wave over a particular period, with sample resolution equal to an electronic phase step resolution, and setting the respective presentation time as the ratio of separation between resulting amplitude values; and
mitigating error arising from harmonics in the source signal by adjusting the modulation signals including varying a respective phase of the modulation signals and varying the respective presentation time for each phase.

* * * * *